(12) United States Patent
Hu et al.

(10) Patent No.: US 9,562,304 B2
(45) Date of Patent: Feb. 7, 2017

(54) POLYCRYSTALLINE SILICON INGOT, PREPARATION METHOD THEREOF, AND POLYCRYSTALLINE SILICON WAFER

(71) Applicant: JIANG XI SAI WEI LDK SOLAR HI-TECH CO., LTD., Xinyu (CN)

(72) Inventors: Dongli Hu, Xinyu (CN); Liang He, Xinyu (CN); Yuepeng Wan, Xinyu (CN); Qi Lei, Xinyu (CN); Hongrong Chen, Xinyu (CN); Tao Zhang, Xinyu (CN); Dejing Zhong, Xinyu (CN)

(73) Assignee: JIANG XI SAI WEI LDK SOLAR HI-TECH CO., LTD., Xinyu (CN)

( * ) Notice: Subject to any disclaimer, the term of this patent is extended or adjusted under 35 U.S.C. 154(b) by 0 days.

(21) Appl. No.: 14/389,452

(22) PCT Filed: Mar. 28, 2013

(86) PCT No.: PCT/CN2013/073364
§ 371 (c)(1),
(2) Date: Sep. 30, 2014

(87) PCT Pub. No.: WO2013/149560
PCT Pub. Date: Oct. 10, 2013

(65) Prior Publication Data
US 2015/0056123 A1    Feb. 26, 2015

(30) Foreign Application Priority Data

Apr. 1, 2012  (CN) .......................... 2012 1 0096188
Apr. 1, 2012  (CN) .......................... 2012 1 0096232
(Continued)

(51) Int. Cl.
*C30B 11/00*    (2006.01)
*C30B 29/06*    (2006.01)
(Continued)

(52) U.S. Cl.
CPC .............. *C30B 11/003* (2013.01); *C30B 11/00* (2013.01); *C30B 11/006* (2013.01); *C30B 11/02* (2013.01);
(Continued)

(58) Field of Classification Search
CPC ...... C30B 11/003; C30B 11/14; C30B 11/006; C30B 11/04; C30B 11/00; C30B 28/06; C30B 29/06; H01L 29/04; H01L 29/16
See application file for complete search history.

(56) References Cited

U.S. PATENT DOCUMENTS

2011/0129403 A1 * 6/2011 Stoddard ............... C30B 11/003
423/348

FOREIGN PATENT DOCUMENTS

CN    102337582 A * 2/2012

* cited by examiner

*Primary Examiner* — Anthony J Zimmer
(74) *Attorney, Agent, or Firm* — Shimokaji IP

(57) ABSTRACT

Disclosed is a preparation method of a polycrystalline silicon ingot. The preparation method comprises: providing a silicon nucleation layer at the bottom of a crucible, and filling a silicon material above the silicon nucleation layer; heating the silicon material to melt same, adjusting the thermal field inside the crucible to make the melted silicon material to start crystallization on the basis of the silicon nucleation layer; and when the crystallization is finished, performing annealing and cooling to obtain a polycrystalline silicon ingot. By adopting the preparation method, a desirable initial nucleus can be obtained for a polycrystalline silicon ingot, so as to reduce dislocation multiplication during the growth of the polycrystalline silicon ingot. Further disclosed are a polycrystalline silicon ingot obtained through the preparation method and a polycrystalline silicon wafer made using the polycrystalline silicon ingot as a raw material.

3 Claims, 6 Drawing Sheets

(30) Foreign Application Priority Data

Apr. 1, 2012 (CN) .......................... 2012 1 0096291
Jan. 29, 2013 (CN) .......................... 2013 1 0033073

(51) Int. Cl.
| | |
|---|---|
| *C30B 28/06* | (2006.01) |
| *C30B 11/02* | (2006.01) |
| *C30B 11/04* | (2006.01) |
| *H01L 29/04* | (2006.01) |
| *H01L 29/16* | (2006.01) |
| *C30B 11/14* | (2006.01) |

(52) U.S. Cl.
CPC .............. *C30B 11/04* (2013.01); *C30B 11/14* (2013.01); *C30B 28/06* (2013.01); *C30B 29/06* (2013.01); *H01L 29/04* (2013.01); *H01L 29/16* (2013.01)

POLYCRYSTALLINE SILICON INGOT, PREPARATION METHOD THEREOF, AND POLYCRYSTALLINE SILICON WAFER

CROSS-REFERENCE TO RELATED APPLICATIONS

The present application claims priority to Chinese Application No. 201210096232.2, entitled A Polycrystalline Silicon Ingot, Preparation Method Thereof, and Polycrystalline Silicon Wafer, filed on Apr. 1, 2012, and Chinese Application No. 201210096188.5, entitled Polycrystalline Silicon Ingot, Preparation Method Thereof, and Polycrystalline Silicon Wafer, filed on Apr. 1, 2012, the entire contents of which are hereby incorporated by reference. The present application claims priority to Chinese Application No. 201210096291.X, entitled Polycrystalline Silicon Ingot and Preparation Method Thereof, Polycrystalline Silicon Wafer, and Crucible for Casting Polycrystalline Silicon Ingot, filed on Apr. 1, 2012, and Chinese Application No. 201310033073.6, entitled Polycrystalline Silicon Ingot, Preparation Method Thereof, and Polycrystalline Silicon Wafer, filed on Jan. 29, 2013, the contents of which are hereby incorporated by reference.

FIELD OF THE INVENTION

The present invention relates to the field of semiconductor manufacture, particularly a polycrystalline silicon ingot, preparation method thereof, and polycrystalline silicon wafer.

BACKGROUND OF THE INVENTION

As an emerging renewable green energy source, solar energy has become a research hotspot. With the rapid development of solar cell industry, polycrystalline silicon which is of low cost and suitable for large-scale production has become one of the leading photovoltaic materials in the art, and is gradually replacing the dominance of the traditional silicon produced by Czochralski process in the solar cell materials market.

Currently, the preparation of polycrystalline silicon ingot mainly adopts directional solidification system method (referred to as DSS) and crystal growth furnace technique provided by GT Solar Company. The method generally comprises heating, melting, solidifying and growing crystals, annealing and cooling steps, etc. In the solidification process of crystal growth, accompanied by the continuous cooling of the bottom of the crucible, the melt silicon nucleated randomly and spontaneously, and then the random nucleation gradually grows. However, since the initial nucleation has not been controlled, the nucleation process is prone to generate dislocations, resulting in disordered crystalline orientations and nonuniform crystalline grains. Thus the polycrystalline silicon ingot obtained by this method is of low quality. The photoelectric conversion efficiency of the solar cell produced by such polycrystalline silicon ingot is relatively low. Therefore, in order to obtain a polycrystalline silicon ingot with low dislocation density, high-quality and less defects, it is very important to provide a DSS method for efficiently creating good initial nucleation of polycrystalline silicon ingot.

SUMMARY OF THE INVENTION

In order to solve the above-mentioned technical problem, the present invention aims to provide a method for preparing polycrystalline silicon ingot. The method enables to obtain good initial nucleation for the polycrystalline silicon ingot, thus reduce the dislocations caused during the growth of polycrystalline silicon ingot and obtain polycrystalline silicon ingot of high quality. The present invention also provides polycrystalline silicon ingot of high quality obtained by using such preparation method, and polycrystalline silicon wafer obtained by using the polycrystalline silicon ingot as raw material.

In a first aspect, the present invention provides a method for preparing polycrystalline silicon ingot, comprising:

providing a nucleating source of silicon material layer at the bottom of a crucible, and feeding silicon onto the nucleating source of silicon material layer;

melt the silicon by heating, and regulate thermal field in the crucible to grow crystals from molten silicon on the base of the nucleating source of silicon material layer;

after the crystallization is completely finished, performing annealing and cooling to obtain polycrystalline silicon ingot.

The term "nucleating source of silicon material layer" herein refers to a nucleating source layer formed by silicon material. "Silicon" used herein is a commonly encountered raw material used for casting ingot in the art.

With regard to the method for preparing polycrystalline silicon ingot provided by the present invention, the nucleation of molten silicon on the solid silicon is homogeneous nucleation. Homogeneous nucleation requires driving force much less than heterogeneous nucleation on quartz or ceramic crucible. Multiple even-distributed nucleating sources can be formed on the solid silicon, thus making polycrystalline silicon ingot to obtain good initial nucleation and growing crystals with dominant crystal orientations. Further, solid silicon has an excellent heat-conducting property, making molten silicon to obtain more driving force during the nucleation, thus promoting control of the initial nucleation and growing crystals with dominant crystal orientations.

Preferably, the method for preparing polycrystalline silicon ingot comprises:

coating inner wall of the crucible with a layer of silicon nitride, followed by feeding silicon from the bottom to the top of the crucible;

melting the silicon in the crucible to form molten silicon by heating; when solid-liquid interface formed by molten silicon and unmelted silicon is close to the bottom of the crucible, regulating thermal field to achieve supercooled state to grow crystals from molten silicon on the base of the unmelted silicon;

after the crystallization of molten silicon is completely finished, performing annealing and cooling to obtain polycrystalline silicon ingot;

the unmelted silicon is the nucleating source of silicon material layer.

Herein, a layer of silicon nitride provided on the inner wall of crucible can efficiently prevent impurities contained in the inner wall of crucible entering into crystals, and avoid "stick-pan" phenomenon of polycrystalline silicon ingot, thus improving quality of polycrystalline silicon ingot and decreasing the operation difficulty of casting process.

When the silicon is not completely melted, the thermal field is regulated to achieve supercooled state to grow crystals from molten silicon on the base of unmelted silicon.

Preferably, a layer of chunk heat conductor is laid between silicon and the bottom of the crucible.

Preferably, the chunk heat conductor is chunk silicon or chunk graphite.

Preferably, the chunk silicon is one or more of chunk monocrystalline silicon, chunk polycrystalline silicon and chunk noncrystalline silicon.

Preferably, thickness of the layer of chunk heat conductor is in a range of 1 cm-2 cm.

Chunk silicon and chunk graphite have excellent heat-conducting property, making molten silicon to obtain more driving force during the nucleation, thus promoting growth of crystalline grains with dominant crystal orientations.

Preferably, during the melting process of silicon, the position of solid-liquid interface formed by molten silicon and unmelted silicon is detected at 0.2-1 hour intervals.

Specifically, the position of solid-liquid interface formed by molten silicon and unmelted silicon is detected by using quartz rod.

Preferably, in preliminary stage of melting process of silicon, the position of solid-liquid interface formed by molten silicon and unmelted silicon is detected at 0.5-1 hour intervals.

Preferably, in later stage of melting process of silicon, the position of solid-liquid interface formed by molten silicon and unmelted silicon is detected at 0.2-0.5 hour intervals.

When solid-liquid interface formed by molten silicon and unmelted silicon is detected to be close to the bottom of the crucible, thermal field should be regulated to achieve super-cooled state to grow crystals from molten silicon on the base of the unmelted silicon.

Preferably, the step of regulating thermal field is regulating heating power to lower the temperature at a speed of 2-500 K/min.

Specifically, to reduce heating power of heating device or to switch off heating device, or to open heat radiator so as to achieve a supercooled state in the thermal field where silicon ingot grows. Crystals nucleate and grow in such supercooled state.

Preferably, the method for preparing polycrystalline silicon ingot comprises:

coating inner wall of the crucible with a layer of silicon nitride, followed by feeding silicon from the bottom to the top of the crucible; the step of feeding silicon further comprises laying a layer of crushed silicon at the bottom of the crucible in advance, the crushed silicon is one or more of crushed monocrystalline silicon, crushed polycrystalline silicon and non-crystalline silicon;

melting silicon in the crucible to form molten silicon by heating, when solid-liquid interface formed by molten silicon and unmelted silicon is just in or deep into the layer of crushed silicon, regulating thermal field to achieve super-cooled state to grow crystals from molten silicon on the base of the layer of crushed silicon;

after the crystallization of molten silicon is completely finished, performing annealing and cooling to obtain polycrystalline silicon ingot.

The layer of crushed silicon is the nucleating source of silicon material layer. Crushed silicon is laid at the bottom of the crucible in random order, and the layer forms a supporting structure having numerous holes. In melting process of silicon, molten silicon formed by melting silicon will fill holes. In preliminary stage of nucleation, under a supercooled state, multiple even-distributed nucleating sources form on the layer of crushed silicon, thus making polycrystalline silicon ingot to obtain good initial nucleation and growing crystals with dominant crystal orientations. Specifically, to control temperature to make molten silicon which is just in solid-liquid interface formed by molten silicon and unmelted silicon, and molten silicon which is filled in the holes to achieve supercooled state firstly, and nucleate and grow crystals. Consequently, interface of molten silicon moves away from the bottom of crucible, molten silicon grows crystals and solidifies. Initial nucleation of polycrystalline silicon ingot is controlled well, thus growing crystals with dominant beneficial crystal orientations, and avoiding large increase of dislocation to obtain polycrystalline silicon ingot of high quality.

Preferably, size of the crushed silicon is in a range of 0.1 μm-10 cm; more preferably, size of the crushed silicon is in a range of 0.1 cm-10 cm.

Herein, crushed silicon having a size of 0.1 82 m-10 μm is micro powder.

Preferably, thickness of the layer of crushed silicon is in a range of 0.5 cm-5 cm.

It is not easy to lay a layer of crushed silicon which is too thin. It is also hard to control. In addition, too thin the layer of crushed silicon is bad for the formation of the complete supporting structure, as well as the subsequent nucleation.

Preferably, a layer of silicon nitride provided on the inner wall of crucible can efficiently prevent impurities contained in the inner wall of crucible entering into crystals, and avoid "stick-pan" phenomenon of polycrystalline silicon ingot, thus improving quality of polycrystalline silicon ingot and decreasing the operation difficulty of casting process.

Preferably, during the melting process of silicon, the position of solid-liquid interface formed by melting silicon is detected at 0.2-1 hour intervals.

Specifically, the position of solid-liquid interface formed by melting silicon is detected by using quartz rod.

Preferably, in preliminary stage of melting process of silicon, the position of solid-liquid interface formed by melting silicon is detected at 0.5-1 hour intervals.

Preferably, in later stage of melting process of silicon, the position of solid-liquid interface formed by melting silicon is detected at 0.2-0.5 hour intervals.

When solid-liquid interface formed by melting silicon is detected to be just in or deep into the layer of crushed silicon, thermal field should be regulated to achieve super-cooled state to grow crystals from molten silicon on the base of the layer of crushed silicon.

Preferably, the step of regulating thermal field is regulating heating power to lower the temperature at a speed of 2-500 K/min.

Specifically, to reduce heating power of heating device or to switch off heating device, or to open heat radiator so as to achieve a supercooled state in the thermal field where silicon ingot grows. Nucleating and growing crystals in such supercooled state.

Preferably, the method for preparing polycrystalline silicon ingot comprises:

(1) providing nucleating source at the bottom of the crucible to form a nucleating source layer; the nucleating source is silicon powder;

(2) providing molten silicon above the nucleating source layer; the step of providing molten silicon above the nucleating source layer is: feeding solid silicon onto the nucleating source layer, melting the silicon by heating the crucible, so that the molten silicon is provided on the surface of the nucleating source layer; or heating solid silicon in another crucible to prepare molten silicon, followed by pouring the molten silicon into the crucible with nucleating source layer, so that the molten silicon is provided on the surface of the nucleating source layer;

(3) controlling the temperature inside the crucible, the temperature raising along the direction perpendicular to the bottom of the crucible to form temperature gradient, making the molten silicon to nucleate and crystallize by using the nucleating source, then obtaining polycrystalline silicon ingot.

Preferably, the silicon powder can be provided at the bottom of the crucible by applying or laying.

Preferably, particle size of silicon powder is in a range of 0.1 μm-1 cm.

In step (3), the step of controlling thermal field in the crucible is cooling molten silicon to achieve supercooled state and nucleate and crystallize. At that moment, presence of numerous silicon powder in good for molten silicon to nucleate rapidly.

Preferably, degree of supercooling is controlled to be in a range of from −1K to −30K. Too low the degree of supercooling leads to slow heat dissipation, at that time (111) plane can develop sufficiently. However, too high the degree of supercooling leads to goo heat dissipation due to fast growth in the (110) (112) directions. A high degree of supercooling is good for forming crystal orientations (110) (112) dominantly. Furthermore, because the grain boundary is area for atomic stagger, dislocations moving toward the grain boundary are absorbed. A suitable amount of the grain boundary can prevent dislocations increasing and expanding, thus reducing the overall dislocations of silicon ingot and improving the conversion efficiency of crystalline silicon.

Preferably, the method for preparing polycrystalline silicon ingot comprises:

(1) laying a microcrystalline nucleating source layer at the bottom of the crucible, the microcrystalline nucleating source layer is microcrystalline silicon and/or amorphous silicon; thickness of the microcrystalline nucleating source layer is a first height; the microcrystalline nucleating source layer is the nucleating source of silicon material (2) feeding silicon onto the microcrystalline nucleating source layer, melting the silicon to form molten silicon by heating, when solid-liquid interface formed after the silicon is melted completely is just in or deep into the microcrystalline nucleating source layer, regulating thermal field to achieve supercooled state to grow crystals from the molten silicon on the base of the microcrystalline nucleating source layer;

(3) after the crystallization of molten silicon is completely finished, performing annealing and cooling to obtain polycrystalline silicon ingot.

Step (1) involves in providing a nucleating source of silicon material layer. Material of the nucleating source of silicon material layer which provides microcrystalline nucleation for the growth of silicon ingot is microcrystalline silicon and/or amorphous silicon.

The microcrystalline silicon, amorphous silicon is laid in any manner; there is no need to arrange manually. There are no limitations to the size of the microcrystalline silicon and amorphous silicon. In addition, source and shape of microcrystalline silicon and amorphous silicon are not limited. Purity of the microcrystalline silicon and amorphous silicon should be no less than 3N.

Preferably, the microcrystalline silicon and/or amorphous silicon should be in a form of rob, chunk, plate, strip or granule.

Preferably, the amorphous silicon is produced by methods such as Siemens method, improved Siemens method, and Fluidized-bed method.

Thickness of the nucleating source of silicon material layer is a first height, which can be determined as needed. Preferably, the first height is in a range of 1-150 mm. More preferably, the first height is in a range of 5-150 mm. Further preferably, the first height is in a range of 5-30 mm.

The crucible refers to container where polycrystalline silicon ingot grows. The shape and type of the crucible are not limited.

Step (2) involves feeding silicon onto the nucleating source of silicon material layer, melting the silicon to form molten silicon by heating, when solid-liquid interface formed after the silicon is melted completely is just in or deep into the nucleating source of silicon material layer, regulating thermal field to achieve supercooled state to grow crystals from the molten silicon on the base of the nucleating source of silicon material layer.

Preferably, in the case where the nucleating source of silicon material layer is microcrystalline silicon or amorphous silicon or combination thereof, when solid-liquid interface formed after silicon is melted completely is deep into the nucleating source of silicon material layer and apart from the bottom of the crucible at least 1 mm, thermal field is regulated to achieve supercooled state to grow crystals from the molten silicon on the base of microcrystalline silicon and/or amorphous silicon.

More preferably, in the case where the nucleating source of silicon material layer is microcrystalline silicon or amorphous silicon or combination thereof, when solid-liquid interface formed after silicon is melted completely is deep into the nucleating source of silicon material layer and apart from the bottom of the crucible at least 5 mm, thermal field is regulated to achieve supercooled state to grow crystals from the molten silicon on the base of microcrystalline silicon and/or amorphous silicon.

The expression "just in the nucleating source of silicon material layer" herein means distance between the solid-liquid interface formed by melting molten silicon and the bottom of the crucible equals to the first height.

Generally, silicon melts at 1500° C.-1560° C. Therefore, in the case where the nucleating source of silicon material layer is microcrystalline silicon or amorphous silicon, it will melt during the process of casting ingot. It is necessary to detect the position of solid-liquid interface formed by molten silicon. After silicon just melt completely or the nucleating source of silicon material layer melt partially, start to regulate thermal field to nucleate and grow crystals.

Preferably, during the melting process of silicon, the position of solid-liquid interface formed after molten silicon is melted is detected at 0.2-1 hour intervals.

Specifically, the position of solid-liquid interface formed after molten silicon is melted is detected by using quartz rod.

Preferably, in preliminary stage of melting process of silicon, the position of solid-liquid interface formed after molten silicon is melted is detected at 0.5-1 hour intervals.

Preferably, in later stage of melting process of silicon, the position of solid-liquid interface formed after molten silicon is melted is detected at 0.2-0.5 hour intervals.

Preferably, the step of regulating thermal field is regulating heating power to lower the temperature at a speed of 2-30 K/min.

Specifically, to reduce heating power of heating device or to switch off heating device, or to open heat radiator so as to achieve a supercooled state in the thermal field where silicon ingot grows. In the supercooled state, crystals grow on the base of microcrystalline nucleation, controlling the temperature to rise along the direction perpendicular to the bottom of the crucible to form temperature gradient.

Because microcrystalline material or amorphous material are arrayed regularly on a atomic or molecular basis, therefore such material in such a range is equivalent to small microcrystalline crystals, which can be used as microcrystalline nucleation for crystallization. When the silicon melts, the molten silicon contacts the microcrystalline material or amorphous material of the nucleating source layer. When the temperature is further reduced, molten silicon grows on the microcrystalline material or amorphous material. Since the presence of numerous micro crystals or microcrystalline nucleation similar to micro crystals contained in microcrystalline material or amorphous material, under the influence of such microcrystalline nucleation, numerous fine crystalline grains grow from molten silicon. After subsequent survival of the fittest growth, crystals of fine uniform grain size and low dislocation density is obtained.

Step (3) involves performing annealing and cooling to obtain polycrystalline silicon ingot after the crystallization of molten silicon is completely finished.

Since numerous fine crystalline grains grow from polycrystalline silicon ingot by taking advantage of microcrystalline nucleation, such fine crystalline grains produce effect that similar to "necking down" to eliminate dislocations by grain boundary. Further, on the basis of the dominant crystalline orientation, after subsequent "survival of the fittest", crystals with dominant beneficial crystal orientations grow, avoiding large increase of dislocation to obtain polycrystalline silicon ingot of high quality.

The nucleating source of silicon material layer laid at the bottom of crucible provides fine nucleation points distributed uniformly, thus obtaining crystals of more fine uniform grain size, of a few defects and slow increase and expansion, and high photoelectric conversion efficiency.

Preferably, the method for preparing polycrystalline silicon ingot comprises:

(1) randomly laying seed crystals with unlimited crystal orientation at the bottom of crucible to form a layer of seed crystals, the layer of seed crystals is the nucleating source of silicon material layer (2) providing molten silicon above the layer of seed crystals, controlling the temperature at the bottom of the crucible below melting point of the seed crystals, making the layer of seed crystals not melt completely;

(3) controlling the temperature inside the crucible, the temperature raising along the direction perpendicular to the bottom of the crucible to form temperature gradient, making the molten silicon growing above the seed crystals, the molten silicon inheriting the structure of the seed crystals, then obtaining polycrystalline silicon ingot.

Seed crystals of step (1) should be laid in any manner. There is no need to arrange manually. There are no limitations to crystalline orientation of the seed crystals. In addition, source, type, shape, maximum side-length and dislocation density of the seed crystals are not limited.

Preferably, seed crystals are materials from the top or the end of silicon ingot, materials from the edge of silicon ingot, defective silicon, crushed fragment of single crystals or finely crushed silicon. Materials from the top or the end of silicon ingot and materials from the edge of silicon ingot are commonly encountered waste materials. Defective silicon and crushed fragment of single crystals are produced during sectioning process of crystalline silicon ingot. Finely crushed silicon is produced by crushing crystalline waste materials of silicon ingot.

Seed crystals should be single crystals or polycrystals. Molten silicon will continue to grow above the seed crystals. The molten silicon inherits the structure of the seed crystals.

Seed crystals should be in a form of plate, chunk, strip or granule. If seed crystal is irregular in shape, crystalline orientation of seed crystals distributes randomly, grain boundary is atomic disordered area. If seed crystal is regular in shape formed by cutting, due to the polyhedron structure of crystals, laying randomly would cause disordered crystalline orientations. Grain boundary is also the area of atomic disordered.

Preferably, maximum side-length of seed crystal is in a range of 1-100 mm. The smaller the maximum side-length of seed crystal, the more different the crystalline orientation of numerous seed crystals, it is prone to form grain boundary of the area for atomic stagger. More preferably, maximum side-length of seed crystal is in a range of 1-50 mm.

Lower dislocation density of seed crystal is more conducive to grow polycrystalline silicon ingot of low dislocation density. Preferably, dislocation density of seed crystal is less than or equal to $10^3$ ($1/cm^2$).

Thickness of the layer of seed crystals is in a range of 0.5 cm-5 cm. Preferably, thickness of the layer of seed crystals is in a range of 5-50 mm.

Thus, seed crystals are used as a nucleating source layer. Source of seed crystals is very extensive and available easily. Compared to seed crystals of continuous large size used in the art, production cost of polycrystalline silicon ingot is greatly reduced. In addition, seed crystals are laid at the bottom of crucible randomly. There is no need to arrange manually, so it is easy to operate.

In step (2), manner of providing molten silicon above layer of seed crystals is not limited. The step of providing molten silicon above layer of seed crystals should be: feeding solid silicon onto the layer of seed crystals, melting silicon by heating the crucible. At that time, the molten silicon is provided on the surface of the layer of seed crystals. Preferably, providing molten silicon above layer of seed crystals should be: heating solid silicon in another crucible to produce molten silicon, pouring the molten silicon into the crucible with the layer of seed crystals. At that time, the molten silicon is provided on the surface of the layer of seed crystals. Source and purity of solid silicon are not limited.

The layer of seed crystals is not completely melted not completely melted means the layer of seed crystals is melted partially and part of the layer of seed crystals maintain unmelted. Preferably, percentage of unmelted seed crystals of initial seed crystals in step (1) is in a range of 5%-95%. Normally, silicon melts at a temperature in a range of 1500° C.-1560° C. Temperature of layer of seed crystals at the bottom of the crucible is below melting point of seed crystals.

(3) controlling the temperature inside the crucible, the temperature raising along the direction perpendicular to the bottom of the crucible to form temperature gradient, making the molten silicon growing above the seed crystals, the molten silicon inheriting the structure of the seed crystals, then obtaining polycrystalline silicon ingot.

Seed crystals are laid at the bottom of crucible in any manner, and the crystalline orientation is not limited, thus polycrystalline silicon ingot of high quality can be obtained. It is because seed crystals laid in any manner provide suitable amount of grain boundary and the grain boundary is area for atomic stagger, dislocations moving toward the grain boundary will be absorbed. Dislocations increasing and expanding can be prevented, thus reducing the overall dislocations of silicon ingot and improving the conversion efficiency and quality of crystalline silicon.

In a second aspect, the present invention provides a polycrystalline silicon ingot prepared by preparation methods as set forth above. The polycrystalline silicon ingot has low dislocation density and few defects.

In a third aspect, the present invention provides a polycrystalline silicon wafer obtained by sectioning, slicing and cleaning the polycrystalline silicon ingot as set forth above.

DETAILED DESCRIPTION OF ILLUSTRATED EMBODIMENTS

The invention will now be described in detail on the basis of preferred embodiments. It is to be understood that various changes may be made without departing from the spirit and scope of the inventions.

EXAMPLE 1

A method for preparing polycrystalline silicon ingot.

Figure 1:
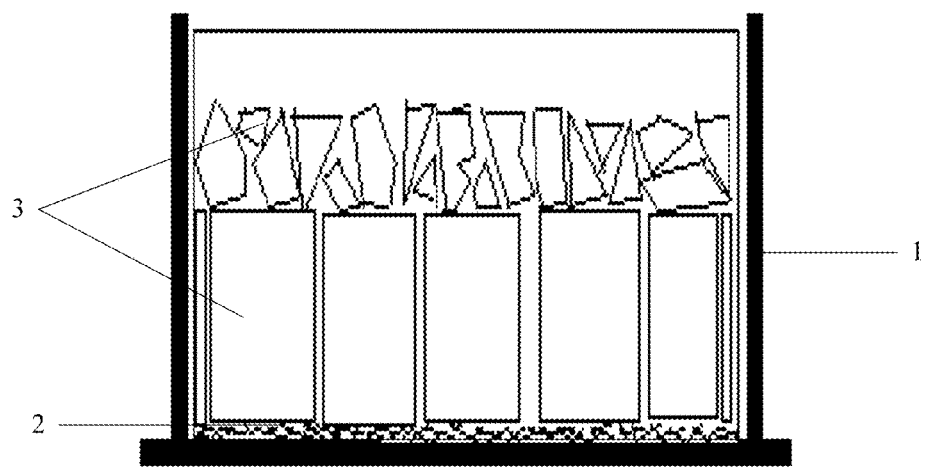
FIG. 1 is a schematic view showing the crucible after feeding feedstock, according to Example 1.

A layer of silicon nitride was provided on inner wall of a quartz crucible by spray coating, followed by laying a layer of crushed polycrystalline silicon having a size of 1-5 cm at the bottom of the crucible. The layer of crushed polycrystalline silicon was 1 cm. Then various chunk silicon was fed onto crushed polycrystalline silicon until the crucible was full. FIG. 1 is a schematic view of one embodiment, showing the crucible after feeding. 1 is crucible, 2 is crushed polycrystalline silicon and 3 is silicon.

The crucible filled with silicon was then placed into a casting furnace. Starting a casting ingot program and vacuuming. And the temperature was elevated to the melting point of silicon by heating so as to melt the silicon slowly. During the melting process, solid-liquid interface formed by molten silicon and unmelted silicon was detected by using quartz rob. In preliminary stage of the melting process, the position was detected once every 2 hours (at 1 hour intervals). In later stage of the melting process, the position was detected at 0.5 hour intervals.

When solid-liquid interface formed by molten silicon and unmelted silicon was detected to be just in the layer of crushed polycrystalline silicon, heat shield was open, thus reducing the temperature and cooling the molten silicon. Temperature was reduced at a speed of 10 K/min. A somewhat supercooled state was achieved. Molten silicon started to grow crystals on the base of unmelted silicon.

After the crystallization of molten silicon was completely finished, performing annealing and cooling to obtain polycrystalline silicon ingot.

The polycrystalline silicon ingot as prepared was then cooled and sectioned to produce chunk polycrystalline silicon, followed by slicing and cleaning, polycrystalline silicon wafer was obtained. The polycrystalline silicon wafer was used as raw material to manufacture solar cell by screen printing technique.

Figure 2:
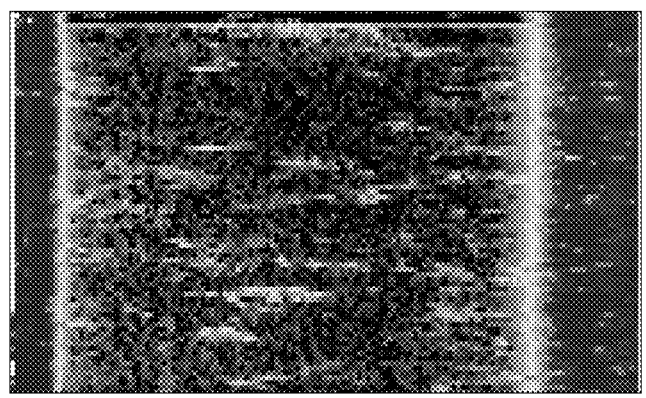
FIG. 2 is a map of minority carrier lifetime of the silicon ingot, according to Example 1.

Minority carrier lifetime of the polycrystalline silicon ingot was tested using WT2000, the test results are shown in FIG. 2. It can be seen from the FIG. 2 that minority carrier lifetime of polycrystalline silicon ingot distributes uniformly from the bottom (right) to the top (left), area for short minority carrier lifetime is small, silicon ingot is of good quality.

Figure 3:
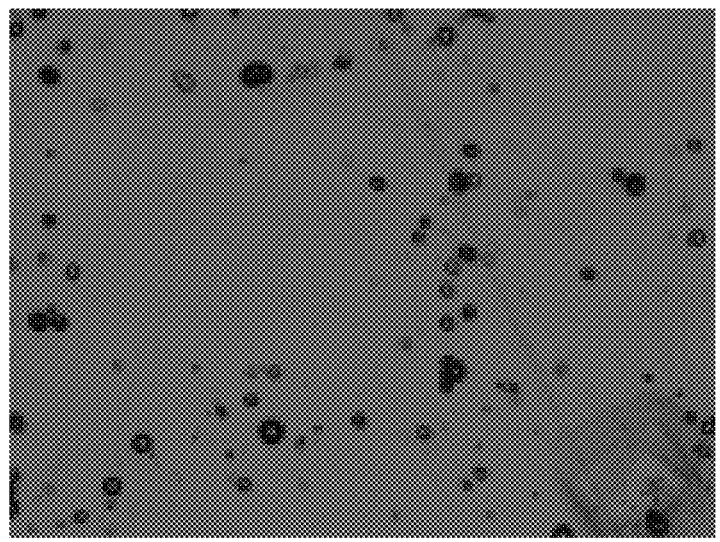
FIG. 3 is a dislocation test pattern of the bottom of silicon ingot, according to Example 1.
Figure 4:
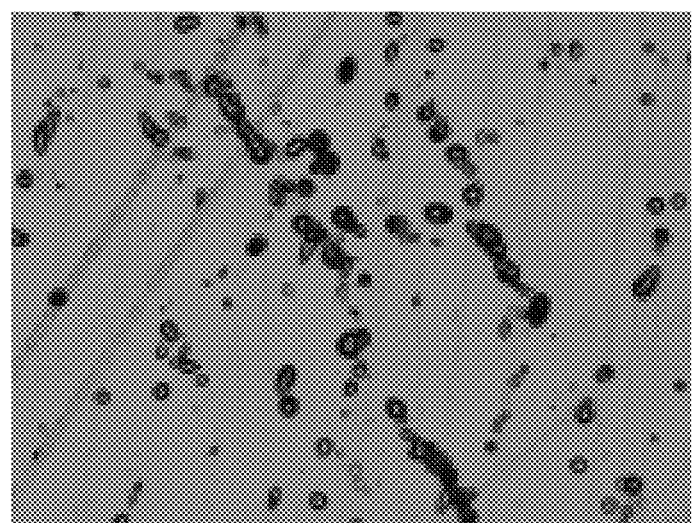
FIG. 4 is a dislocation test pattern of the top of silicon ingot, according to Example 1.

As for the obtained polycrystalline silicon ingot, dislocation was observed by using optical microscope (magnified 100 times). Test results showed that: average dislocation density at the bottom of the silicon ingot was $2.96 \times 10^4$ ($1/cm^2$), average dislocation density at the top of the silicon ingot was $3.41 \times 10^4$ ($1/cm^2$). FIG. 3 shows test results of dislocation at the bottom of the silicon ingot. FIG. 4 shows test results of dislocation at the top of the silicon ingot.

Photoelectric conversion efficiency of the solar cell was tested by using a test system for solar cells (Halm, a German company). Test results showed that the photoelectric conversion efficiency of the solar cell was 17.3%.

EXAMPLE 2

A method for preparing polycrystalline silicon ingot.

A layer of silicon nitride was provided on inner wall of a quartz crucible by spray coating. And then a layer of chunk polycrystalline silicon was laid at the bottom of the crucible, followed by laying a layer of crushed polycrystalline material having a size of 1-5 cm. Thickness of the layer of chunk polycrystalline silicon was 1 cm. Thickness of the layer of crushed polycrystalline material was 2 cm. After that, various chunk silicon was fed onto crushed polycrystalline material until the crucible was full.

The crucible filled with silicon was then placed into a casting furnace. Starting a casting ingot program and vacuuming. And the temperature was elevated to the melting point of silicon by heating so as to melt the silicon slowly. During the melting process, solid-liquid interface formed by molten silicon and unmelted silicon was detected by using quartz rob. In preliminary stage of the melting process, the position was detected once every 2 hours (at 1 hour intervals). In later stage of the melting process, the position was detected at 0.5 hour intervals.

When solid-liquid interface formed by molten silicon and unmelted silicon was detected to be deep into the layer of crushed polycrystalline silicon a distance of 0.5 cm, heat shield was open, thus reducing the temperature and cooling the molten silicon. Temperature was reduced at a speed of 20 K/min. A somewhat supercooled state was achieved. Molten silicon started to grow crystals on the base of unmelted silicon.

After the crystallization of molten silicon was completely finished, performing annealing and cooling to obtain polycrystalline silicon ingot.

The polycrystalline silicon ingot as prepared was then cooled and sectioned to produce chunk polycrystalline silicon, followed by slicing and cleaning, polycrystalline silicon wafer was obtained. The polycrystalline silicon wafer was used as raw material to manufacture solar cell by screen printing technique.

As for the obtained polycrystalline silicon ingot, dislocation was observed by using optical microscope (magnified 200 times). Test results showed that: average dislocation density at the bottom of the silicon ingot was $2.8 \times 10^4$ (1/cm$^2$), average dislocation density at the top of the silicon ingot was $3.40 \times 10^4$ (1/cm$^2$).

Photoelectric conversion efficiency of the solar cell was tested by using a test system for solar cells (Halm, a German company). Test results showed that the photoelectric conversion efficiency of the solar cell was 17.46%.

EXAMPLE 3

A method for preparing polycrystalline silicon ingot.

A layer of silicon nitride was provided on inner wall of a quartz crucible by spray coating. And then a layer of graphite plate of high strength, high density and high purity was laid at the bottom of the crucible, followed by laying a layer of crushed polycrystalline material having a size of 1-5 cm. Thickness of the layer of graphite plate was 1 cm. Thickness of the layer of crushed polycrystalline material was 0.5 cm. After that, various chunk silicon was fed onto crushed polycrystalline material until the crucible was full.

The crucible filled with silicon was then placed into a casting furnace. Starting a casting ingot program and vacuuming. And the temperature was elevated to the melting point of silicon by heating so as to melt the silicon slowly. During the melting process, solid-liquid interface formed by molten silicon and unmelted silicon was detected by using quartz rob. In preliminary stage of the melting process, the position was detected once every 2 hours (at 1 hour intervals). In later stage of the melting process, the position was detected at 0.5 hour intervals.

When solid-liquid interface formed by molten silicon and unmelted silicon was detected to be deep into the layer of crushed polycrystalline silicon a distance of 0.2 cm, heat shield was open, thus reducing the temperature and cooling the molten silicon. Temperature was reduced at a speed of 15 K/min. A somewhat supercooled state was achieved. Molten silicon started to grow crystals on the base of unmelted silicon.

After the crystallization of molten silicon was completely finished, performing annealing and cooling to obtain polycrystalline silicon ingot.

The polycrystalline silicon ingot as prepared was then cooled and sectioned to produce chunk polycrystalline silicon, followed by slicing and cleaning, polycrystalline silicon wafer was obtained. The polycrystalline silicon wafer was used as raw material to manufacture solar cell by screen printing technique.

As for the obtained polycrystalline silicon ingot, dislocation was observed by using optical microscope (magnified 200 times). Test results showed that: average dislocation density at the bottom of the silicon ingot was $3.1 \times 10^4$ (1/cm$^2$), average dislocation density at the top of the silicon ingot was $3.56 \times 10^4$ (1/cm$^2$).

Photoelectric conversion efficiency of the solar cell was tested by using a test system for solar cells (Halm, a German company). Test results showed that the photoelectric conversion efficiency of the solar cell was 17.53%.

EXAMPLE 4

A method for preparing polycrystalline silicon ingot.

A layer of silicon nitride was provided on inner wall of a quartz crucible by spray coating, followed by feeding various chunk silicon onto the crucible from the bottom to the top until the crucible was full.

The crucible filled with silicon was then placed into a casting furnace. Starting a casting ingot program and vacuuming. And the temperature was elevated to the melting point of silicon by heating so as to melt the silicon slowly. During the melting process, solid-liquid interface formed by molten silicon and unmelted silicon was detected by using quartz rob. In preliminary stage of the melting process, the position was detected once every 2 hours (at 1 hour intervals). In later stage of the melting process, the position was detected at 0.5 hour intervals.

When the distance between the bottom of the crucible and the solid-liquid interface formed by molten silicon and unmelted silicon was detected to be 0.2 cm, heat shield was open, thus reducing the temperature and cooling the molten silicon. Temperature was reduced at a speed of 15 K/min. A somewhat supercooled state was achieved. Molten silicon started to grow crystals on the base of unmelted silicon.

After the crystallization of molten silicon was completely finished, performing annealing and cooling to obtain polycrystalline silicon ingot.

The polycrystalline silicon ingot as prepared was then cooled and sectioned to produce chunk polycrystalline silicon, followed by slicing and cleaning, polycrystalline silicon wafer was obtained. The polycrystalline silicon wafer was used as raw material to manufacture solar cell by screen printing technique.

As for the obtained polycrystalline silicon ingot, dislocation was observed by using optical microscope (magnified 200 times). Test results showed that: average dislocation density at the bottom of the silicon ingot was $3.12 \times 10^4$ (1/cm$^2$), average dislocation density at the top of the silicon ingot was $3.58 \times 10^4$ (1/cm$^2$).

Photoelectric conversion efficiency of the solar cell was tested by using a test system for solar cells (Halm, a German company). Test results showed that the photoelectric conversion efficiency of the solar cell was 17.48%.

EXAMPLE 5

A method for preparing polycrystalline silicon ingot.

(1) Nucleating source was provided at the bottom of a crucible to form a nucleating source layer, wherein the step of providing nucleating source at the bottom of a crucible was: applying 200 g of silicon powder at the bottom of a crucible which had been coated with a layer of silicon nitride in advance. Then the crucible was roasted in an oven at 600° C. for 2 hours. Particle size of the silicon powder was 1 mm.

(2) Molten silicon was provided above the nucleating source layer, wherein the step of providing molten silicon above the nucleating source layer was: feeding 450-800 kg of solid silicon above the nucleating source layer, then melting the solid silicon by heating the crucible and elevating the temperature to 1560° C. At that moment, molten silicon was provided on the surface of the nucleating source layer.

(3) controlling the temperature inside the crucible, the temperature raising along the direction perpendicular to the bottom of the crucible to form temperature gradient, making the molten silicon nucleating and forming crystals by using the nucleating source, then obtaining polycrystalline silicon ingot. Herein, open heat shield and control the bottom temperature at 1360° C. to make the molten silicon liquid in a supercooled state, then nucleating and growing crystals by using nucleating source. Polycrystalline silicon ingot was obtained.

Dislocation density of the polycrystalline silicon ingot prepared according to this embodiment was in a range of $3.6 \times 10^3$-$4.8 \times 10^3$ ($1/cm^2$), minority carrier lifetime was 18 microseconds (ms).

Polycrystalline silicon wafer prepared by using the polycrystalline silicon ingot of this embodiment was suitable for manufacturing solar cell. Conversion efficiency of the obtained solar cell was 17.6%.

EXAMPLE 6

A method for preparing polycrystalline silicon ingot.

Figure 5:
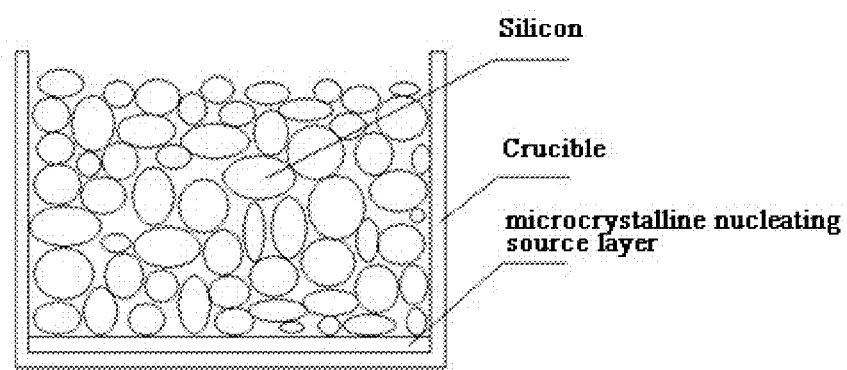
FIG. 5 is a schematic view showing the crucible after feeding feedstock, according to Example 6.

(1) Amorphous rob silicon of high purity produced by Siemens was laid at the bottom of a crucible to form microcrystalline nucleating source layer. Silicon was fed onto the microcrystalline nucleating source layer until the crucible was full. FIG. 5 is a schematic view of this embodiment, showing the crucible after feeding. Thickness of the microcrystalline nucleating source layer was 120 mm.

(2) The crucible filled with silicon was then placed into a casting furnace. Starting a casting ingot program and vacuuming. And the temperature was elevated to 1530° C. by heating so as to melt the silicon slowly and form molten silicon. During the melting process, solid-liquid interface formed by molten silicon was detected by using quartz rob. In preliminary stage of the melting process, the position was detected once every 2 hours (at 1 hour intervals). In later stage of the melting process, the position was detected at 0.5 hour intervals.

(3) When distance between the bottom of the crucible and the solid-liquid interface formed by melting molten silicon was detected to be 15 mm, heat shield was open, thus reducing the temperature and cooling the molten silicon. Temperature was reduced at a speed of 5 K/min. A somewhat supercooled state was achieved. Molten silicon started to grow crystals on the base of the amorphous rob silicon of high purity.

(4) after the crystallization of molten silicon was completely finished, performing annealing and cooling to obtain polycrystalline silicon ingot.

The polycrystalline silicon ingot as prepared was then cooled and sectioned to produce chunk polycrystalline silicon, followed by slicing and cleaning, polycrystalline silicon wafer was obtained. The polycrystalline silicon wafer was used as raw material to manufacture solar cell by screen printing technique.

Figure 6:
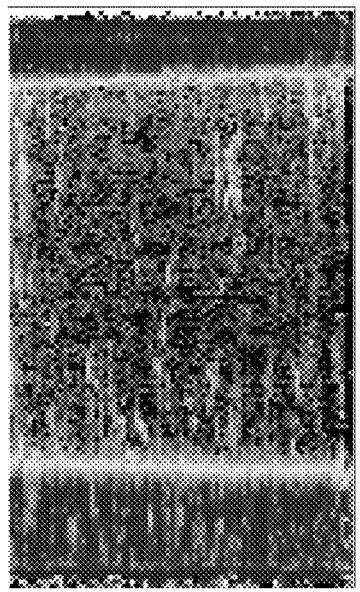
FIG. 6 is a map of minority carrier lifetime of the polycrystalline silicon ingot, according to Example 6.

Minority carrier lifetime of the obtained polycrystalline silicon ingot was tested by using WT2000. Test results were shown in FIG. 6. It can be seen from FIG. 6 that the polycrystalline silicon ingot was of long minority carrier lifetime and small dislocations.

As for the obtained polycrystalline silicon ingot, dislocation was observed by using optical microscope (magnified 200 times). Test results showed that: average dislocation density at the bottom of the silicon ingot was $2.2 \times 10^4$ ($1/cm^2$).

Figure 7:
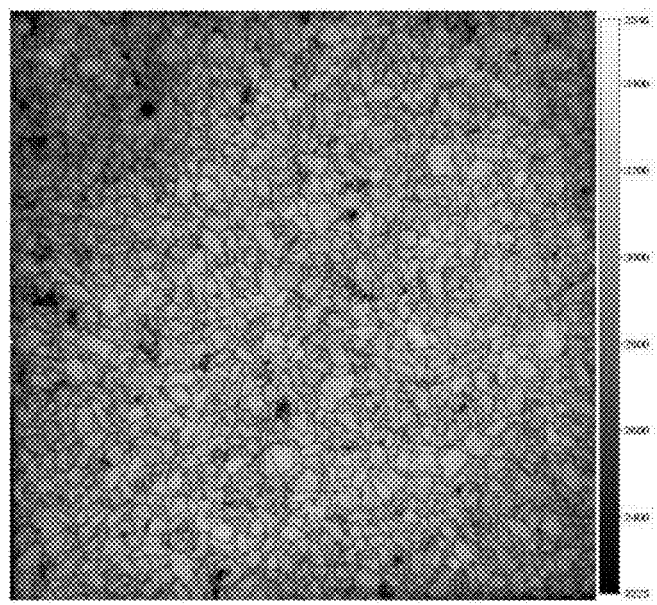
FIG. 7 is a photoluminescence spectrum of polycrystalline silicon wafer according to Example 6.

Dislocations of polycrystalline silicon wafer were inspected by using photoluminescence spectra. Test results were shown in FIG. 7. It can be seen from FIG. 7 that the polycrystalline silicon wafer was of small dislocations and fine and uniform crystalline grains.

Photoelectric conversion efficiency of the solar cell was tested by using a test system for solar cells (Halm, a German company). Test results showed that the photoelectric conversion efficiency of the solar cell was 17.8%.

EXAMPLE 7

A method for preparing polycrystalline silicon ingot.

(1) Amorphous rob silicon of high purity produced by Siemens was crushed and then laid at the bottom of a crucible to form microcrystalline nucleating source layer. Silicon was fed onto the microcrystalline nucleating source layer. Thickness of the microcrystalline nucleating source layer was 50 mm.

(2) The crucible filled with silicon was then placed into a casting furnace. Starting a casting ingot program and vacuuming. And the temperature was elevated to 1540° C. by heating so as to melt the silicon slowly and form molten silicon. During the melting process, solid-liquid interface formed by molten silicon was detected by using quartz rob. In preliminary stage of the melting process, the position was detected once every 2 hours (at 1 hour intervals). In later stage of the melting process, the position was detected at 0.5 hour intervals.

(3) When distance between the bottom of the crucible and the solid-liquid interface formed by molten silicon is detected to be 30 mm, heat shield was open, thus reducing the temperature and cooling the molten silicon. Temperature was reduced at a speed of 6 K/min. A somewhat supercooled state was achieved. Molten silicon started to grow crystals on the base of the amorphous rob silicon of high purity.

(4) after the crystallization of molten silicon was completely finished, performing annealing and cooling to obtain polycrystalline silicon ingot.

The polycrystalline silicon ingot as prepared was then cooled and sectioned to produce chunk polycrystalline silicon, followed by slicing and cleaning, polycrystalline silicon wafer was obtained. The polycrystalline silicon wafer was used as raw material to manufacture solar cell by screen printing technique.

As for the obtained polycrystalline silicon ingot, dislocation was observed by using optical microscope (magnified 200 times). Test results showed that: average dislocation density at the bottom of the silicon ingot was $8.5 \times 10^3$ ($1/cm^2$).

Photoelectric conversion efficiency of the solar cell was tested by using a test system for solar cells (Halm, a German company). Test results showed that the photoelectric conversion efficiency of the solar cell was 18.0%.

EXAMPLE 8

A method for preparing polycrystalline silicon ingot.

(1) Silicon of high purity produced by Fluidized-bed method was laid at the bottom of a crucible to form microcrystalline nucleating source layer. Silicon was fed onto the microcrystalline nucleating source layer until the crucible was full. Thickness of the microcrystalline nucleating source layer was 15 mm.

(2) The crucible filled with silicon was then placed into a casting furnace. Starting a casting ingot program and vacuuming. And the temperature was elevated to 1500° C. by heating so as to melt the silicon slowly. During the melting process, solid-liquid interface formed by molten silicon was detected by using quartz rob. In preliminary stage of the melting process, the position was detected once every 2 hours (at 1 hour intervals). In later stage of the melting process, the position was detected at 0.5 hour intervals.

(3) When distance between the bottom of the crucible and the solid-liquid interface formed by molten silicon was detected to be 10 mm, heat shield was open, thus reducing the temperature and cooling the molten silicon. Temperature was reduced at a speed of 15 K/min. A somewhat super-cooled state was achieved. Molten silicon started to grow crystals on the base of the microcrystalline silicon.

(4) after the crystallization of molten silicon was completely finished, performing annealing and cooling to obtain polycrystalline silicon ingot.

The polycrystalline silicon ingot as prepared was then cooled and sectioned to produce chunk polycrystalline silicon, followed by slicing and cleaning, polycrystalline silicon wafer was obtained. The polycrystalline silicon wafer was used as raw material to manufacture solar cell by screen printing technique.

As for the obtained polycrystalline silicon ingot, dislocation was observed by using optical microscope (magnified 200 times). Test results showed that: average dislocation density at the bottom of the silicon ingot was $3.5 \times 10^4$ ($1/cm^2$).

Photoelectric conversion efficiency of the solar cell was tested by using a test system for solar cells (Halm, a German company). Test results showed that the photoelectric conversion efficiency of the solar cell was 17.6%.

EXAMPLE 9

A method for preparing polycrystalline silicon ingot.

(1) randomly laying seed crystals with unlimited crystal orientation at the bottom of crucible to form a layer of seed crystals;

Seed crystals herein were pieces of single crystals produced in the manufacture of semiconductor. Seed crystals were single crystals in a form of plate. The maximum side-length was 20 mm, dislocation density is less than or equal to $10^3$ ($1/cm^2$), thickness of the layer of seed crystals was 50 mm.

Figure 8:
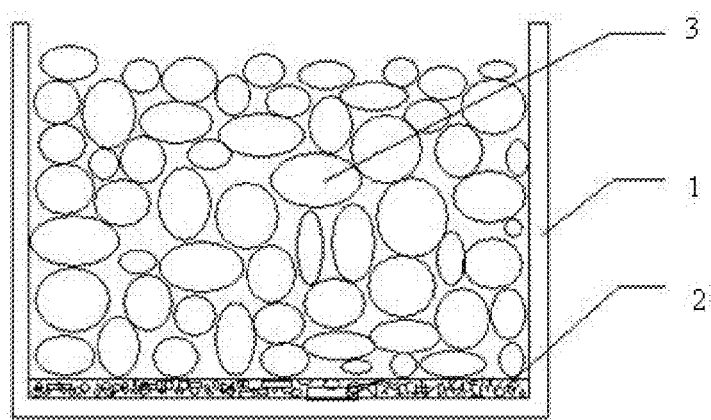
FIG. 8 is a schematic view showing the preparation according to Example 9.

(2) providing molten silicon above the layer of seed crystals, controlling the temperature at the bottom of the crucible below melting point of the seed crystals, making the layer of seed crystals not completely melted not completely melted;

FIG. 8 shows the preparation according to this embodiment, wherein 1 is crucible, 2 is layer of seed crystals, 3 is silicon. The step of providing molten silicon above the layer of seed crystals was: feeding solid silicon, melting the silicon by heating the crucible and elevating the temperature to 1530° C. At that moment, molten silicon was provided on the surface of the layer of seed crystals. Temperature at the bottom of the crucible was 1412° C. Percentage of unmelted seed crystals of initial seed crystals in step (1) was 60%.

(3) controlling the temperature inside the crucible, the temperature raising along the direction perpendicular to the bottom of the crucible to form temperature gradient, making the molten silicon growing above the seed crystals, the molten silicon inheriting the structure of the seed crystals, then obtaining polycrystalline silicon ingot.

Figure 9:
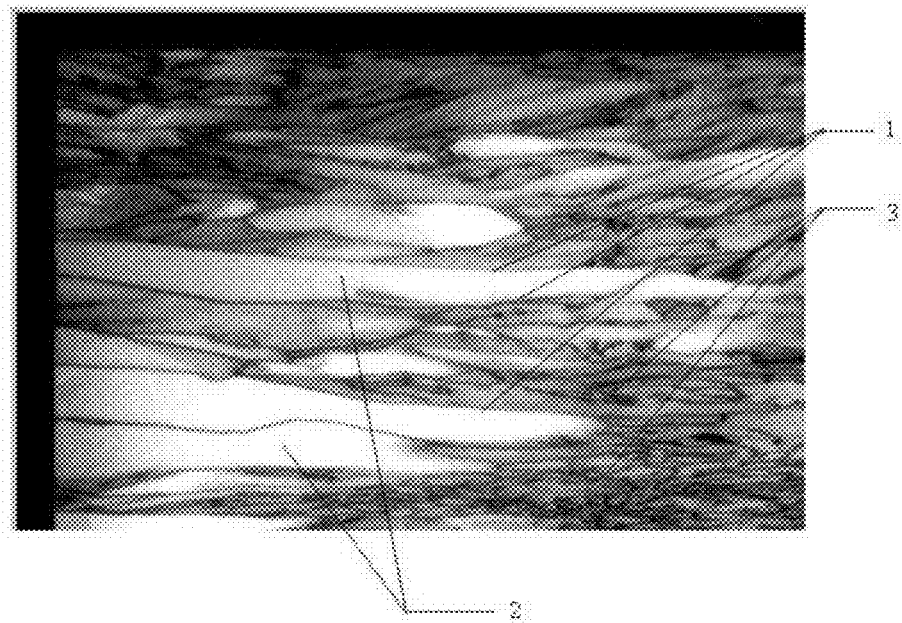
FIG. 9 is an image showing prevention of dislocation observed by photoluminescence silicon wafer inspection system, according to Example 9.

FIG. 9 is an image showing prevention of dislocation observed by photoluminescence silicon wafer inspection system, according to this embodiment. As shown in FIG. 9, 1 is grain boundary, 2 is no-dislocation area, 3 is dislocation area, dislocations of grain boundary 1 moving is refrained obviously, and no-dislocation area 2 and dislocation area 3 formed at two sides of grain boundary 1.

Dislocation density of the polycrystalline silicon ingot prepared according to this embodiment was in a range of $1.5 \times 10^3$-$1.8 \times 10^3$ ($1/cm^2$), minority carrier lifetime was 25 microseconds (ms).

Polycrystalline silicon wafer prepared by using the polycrystalline silicon ingot of this embodiment was suitable for manufacturing solar cell. Conversion efficiency of the obtained solar cell was 17.8%.

EXAMPLE 10

A method for preparing polycrystalline silicon ingot.

(1) randomly laying seed crystals with unlimited crystal orientation at the bottom of crucible to form a layer of seed crystals;

Seed crystals herein were pieces of single crystals produced in the manufacture of semiconductor. Seed crystals were single crystals in a form of chunk. The maximum side-length was 100 mm, dislocation density was less than or equal to $10^3$ ($1/cm^2$), thickness of the layer of seed crystals was 50 mm.

(2) providing molten silicon above the layer of seed crystals, controlling the temperature at the bottom of the crucible below melting point of the seed crystals, making the layer of seed crystals not completely melted not completely melted;

The step of providing molten silicon above the layer of seed crystals was: feeding solid silicon, melting the silicon by heating the crucible and elevating the temperature to 1560° C. At that moment, molten silicon was provided on the surface of the layer of seed crystals. Temperature at the bottom of the crucible was 1412° C. Percentage of unmelted seed crystals of initial seed crystals in step (1) was 95%.

(3) controlling the temperature inside the crucible, the temperature raising along the direction perpendicular to the bottom of the crucible to form temperature gradient, making the molten silicon growing above the seed crystals, the molten silicon inheriting the structure of the seed crystals, then obtaining polycrystalline silicon ingot.

Dislocation density of the polycrystalline silicon ingot prepared according to this embodiment was in a range of $7.5 \times 10^3$-$8.0 \times 10^3$ ($1/cm^2$), minority carrier lifetime was 18 microseconds (ms).

Polycrystalline silicon wafer prepared by using the polycrystalline silicon ingot of this embodiment was suitable for manufacturing solar cell. Conversion efficiency of the obtained solar cell was 17.8%.

EXAMPLE 11

A method for preparing polycrystalline silicon ingot.

(1) randomly laying seed crystals with unlimited crystal orientation at the bottom of crucible to form a layer of seed crystals;

Seed crystals herein were pieces of single crystals produced in the manufacture of semiconductor. Seed crystals were single crystals in a form of granule. The maximum side-length was 1 mm, dislocation density was less than or equal to $10^3$ ($1/cm^2$), thickness of the layer of seed crystals was 5 mm.

(2) providing molten silicon above the layer of seed crystals, controlling the temperature at the bottom of the crucible below melting point of the seed crystals, making the layer of seed crystals not completely melted not completely melted;

The step of providing molten silicon above the layer of seed crystals was: feeding solid silicon, melting the silicon by heating the crucible and elevating the temperature to 1500° C. At that moment, molten silicon was provided on the surface of the layer of seed crystals. Temperature at the bottom of the crucible was 1412° C. Percentage of unmelted seed crystals of initial seed crystals in step (1) was 5%.

(3) controlling the temperature inside the crucible, the temperature raising along the direction perpendicular to the bottom of the crucible to form temperature gradient, making the molten silicon growing above the seed crystals, the molten silicon inheriting the structure of the seed crystals, then obtaining polycrystalline silicon ingot.

Dislocation density of the polycrystalline silicon ingot prepared according to this embodiment was in a range of $3.5 \times 10^4$-$4.8 \times 10^4$ ($1/cm^2$), minority carrier lifetime was 10 microseconds (ms).

Polycrystalline silicon wafer prepared by using the polycrystalline silicon ingot of this embodiment was suitable for manufacturing solar cell. Conversion efficiency of the obtained solar cell was 17.1%.

EXAMPLE 12

A method for preparing polycrystalline silicon ingot.

(1) randomly laying seed crystals with unlimited crystal orientation at the bottom of crucible to form a layer of seed crystals;

Seed crystals herein were pieces of single crystals produced in the manufacture of semiconductor. Seed crystals were single crystals in a form of granule. The maximum side-length was 50 mm, dislocation density was less than or equal to $10^3$ ($1/cm^2$), thickness of the layer of seed crystals was 50 mm.

(2) providing molten silicon above the layer of seed crystals, controlling the temperature at the bottom of the crucible below melting point of the seed crystals, making the layer of seed crystals not completely melted;

The step of providing molten silicon above the layer of seed crystals was: heating solid silicon in another crucible to prepare molten silicon, followed by pouring the molten silicon into the crucible with a layer of seed crystals. At that moment, the molten silicon was provided on the surface of the layer of seed crystals. Temperature at the bottom of the crucible was 1413° C. Percentage of unmelted seed crystals of initial seed crystals in step (1) was 95%.

(3) controlling the temperature inside the crucible, the temperature raising along the direction perpendicular to the bottom of the crucible to form temperature gradient, making the molten silicon growing above the seed crystals, the molten silicon inheriting the structure of the seed crystals, then obtaining polycrystalline silicon ingot.

Dislocation density of the polycrystalline silicon ingot prepared according to this embodiment was in a range of $3.2 \times 10^4$-$3.8 \times 10^4$ ($1/cm^2$), minority carrier lifetime was 15 microseconds (ms).

Polycrystalline silicon wafer prepared by using the polycrystalline silicon ingot of this embodiment was suitable for manufacturing solar cell. Conversion efficiency of the obtained solar cell was 17.5%.

EXAMPLE 13

A method for preparing polycrystalline silicon ingot.

(1) randomly laying seed crystals with unlimited crystal orientation at the bottom of crucible to form a layer of seed crystals;

Seed crystals herein were pieces of single crystals produced in the manufacture of semiconductor. Seed crystals were polycrystals in a form of granule. The maximum side-length was 1 mm, dislocation density was less than or equal to $10^3$ ($1/cm^2$), thickness of the layer of seed crystals was 5 mm.

(2) providing molten silicon above the layer of seed crystals, controlling the temperature at the bottom of the crucible below melting point of the seed crystals, making the layer of seed crystals not completely melted;

The step of providing molten silicon above the layer of seed crystals was: feeding solid silicon, melting the silicon by heating the crucible and elevating the temperature to 1500° C. At that moment, molten silicon was provided on the surface of the layer of seed crystals. Temperature at the bottom of the crucible was 1412° C. Percentage of unmelted seed crystals of initial seed crystals in step (1) was 60%.

(3) controlling the temperature inside the crucible, the temperature raising along the direction perpendicular to the bottom of the crucible to form temperature gradient, making the molten silicon growing above the seed crystals, the molten silicon inheriting the structure of the seed crystals, then obtaining polycrystalline silicon ingot.

Dislocation density of the polycrystalline silicon ingot prepared according to this embodiment was in a range of $1.2 \times 10^4$-$1.8 \times 10^4$ ($1/cm^2$), minority carrier lifetime was 10 microseconds (ms).

Polycrystalline silicon wafer prepared by using the polycrystalline silicon ingot of this embodiment was suitable for manufacturing solar cell. Conversion efficiency of the obtained solar cell was 17.2%.

EXAMPLE 14

A method for preparing polycrystalline silicon ingot.

(1) randomly laying seed crystals with unlimited crystal orientation at the bottom of crucible to form a layer of seed crystals;

Seed crystals herein were pieces of single crystals produced in the manufacture of semiconductor. Seed crystals were single crystals in a form of chunk. The maximum side-length was 40 mm, dislocation density was less than or equal to $10^3$ ($1/cm^2$), thickness of the layer of seed crystals was 40 mm.

(2) providing molten silicon above the layer of seed crystals, controlling the temperature at the bottom of the crucible below melting point of the seed crystals, making the layer of seed crystals not completely melted;

The step of providing molten silicon above the layer of seed crystals was: heating solid silicon in another crucible to prepare molten silicon, followed by pouring the molten silicon into the crucible with a layer of seed crystals. At that moment, the molten silicon was provided on the surface of the layer of seed crystals. Temperature at the bottom of the crucible was 1413° C. Percentage of unmelted seed crystals of initial seed crystals in step (1) was 5%.

(3) controlling the temperature inside the crucible, the temperature raising along the direction perpendicular to the bottom of the crucible to form temperature gradient, making the molten silicon growing above the seed crystals, the molten silicon inheriting the structure of the seed crystals, then obtaining polycrystalline silicon ingot.

Dislocation density of the polycrystalline silicon ingot prepared according to this embodiment was in a range of $5.0 \times 10^3$-$5.6 \times 10^3$ ($1/cm^2$), minority carrier lifetime was 12 microseconds (ms).

Polycrystalline silicon wafer prepared by using the polycrystalline silicon ingot of this embodiment was suitable for manufacturing solar cell. Conversion efficiency of the obtained solar cell was 17.4%.

EXAMPLE ILLUSTRATING THE EFFECTS

In order to support benefits of the present invention, comparative experiment data are provided below.

Comparative experiment 1: A complete single crystal rob was provided. After removing portions at the top or the end or the edge, it was sectioned into seed crystal cubes having a size of 156 mm×156 mm. The monocrystalline cubes were laid at the bottom of crucible regularly, until the bottom of crucible was completely covered, followed by laying silicon onto seed crystals. Melting at high temperature and controlling seed crystals at the bottom not completely melted.

Controlling temperature gradient and cooling the bottom first. Molten silicon liquid grows crystals on the surface of seed crystals, and quasi-monocrystalline silicon ingot having a monocrystalline structure was obtained.

Comparative experiment 2: Growth of an ordinary polycrystalline silicon ingot comprising: feeding silicon into crucible, melting silicon by heating the crucible to control the thermal field in the crucible, so as to make molten silicon grows at the bottom of crucible and obtain polycrystalline silicon ingot.

Comparison of Example 9, Example 10, comparative experiment 1 and comparative experiment 2 are shown below:

ment 2 prepares polycrystalline silicon ingot of short minority carrier lifetime, large area for minority carrier having short lifetime in the center, and high dislocations.

Above all, layer of seed crystals of the present invention is nucleating source of silicon material layer. The obtained polycrystalline silicon ingot having a dislocation density less than $10^5$ 1/cm$^2$, minority carrier lifetime is in a range of 10-25 ms. However, silicon ingot obtained by traditional method has a dislocation density in a range of $10^5$-$10^6$ 1/cm$^2$, minority carrier lifetime is in a range of 5-10 ms. Thus the polycrystalline silicon wafer prepared by using polycrystalline silicon ingot is suitable for manufacturing solar cell. The prepared solar cell has a conversion efficiency in a range of 17.1%~17.8%, whereas solar cell prepared by using ordinary polycrystalline silicon wafer has a conversion efficiency in a range of 16.5~16.9%. Efficiency of quasi-single crystals is in a range of 17.2%-18.5%.

While the present invention has been described with reference to particular embodiments, it will be understood that the embodiments are illustrative and that the invention scope is not so limited. Alternative embodiments of the present invention will become apparent to those having ordinary skill in the art to which the present invention pertains. Such alternate embodiments are considered to be encompassed within the spirit and scope of the present invention. Accordingly, the scope of the present invention is described by the appended claims and is supported by the foregoing description.

TABLE 1

Comparison of Example 9, Example 10, comparative experiment 1 and comparative experiment 2

|  | Example 9 | Example 10 | Comparative experiment 1 | Comparative experiment 2 |
| --- | --- | --- | --- | --- |
| Characteristic of seed crystals | In a form of fragment | Fragment from the edge of single crystals | Large area | No |
| Source of seed crystals | Waste material produced during the manufacture of semiconductor | Crushed fragment from the edge of single crystals | Complete single crystal rob obtained by sectioning after removing portions at the top and the end and the edge | No |
| Price | No cost in non-silicon material | 2 RMB/kg (non-silicon material) | High, 400-800 RMB/kg (non-silicon material) | No |
| Characteristic of product | Multycrystals of high efficiency dislocation density lower than $10^5$ 1/cm$^2$, minority carrier lifetime is 15~25 ms | Multycrystals of high efficiency dislocation density lower than $10^5$ 1/cm$^2$, minority carrier lifetime is 10~20 ms | Quasi-single crystals dislocation density lower than $10^5$ 1/cm$^2$, minority carrier lifetime is 15~25 ms | Ordinary multycrystals dislocation density lower than $10^5$-$10^6$ 1/cm$^2$, minority carrier lifetime is 5~10 ms |

Figure 10:
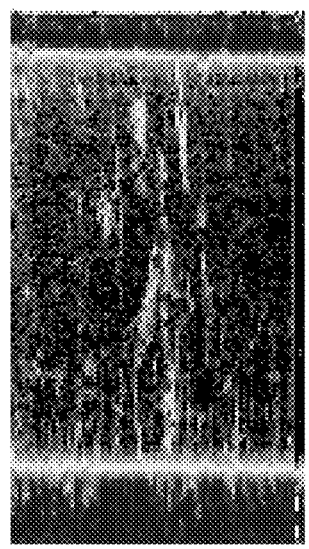
FIG. 10 is a map of minority carrier lifetime of the polycrystalline silicon ingot, according to Example 9.
Figure 11:
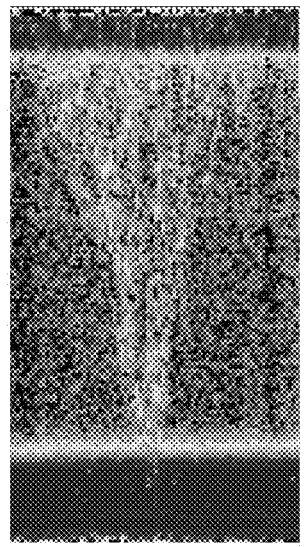
FIG. 11 is a map of minority carrier lifetime of the quasi-single crystal, according to comparative experiment 1.
Figure 12:
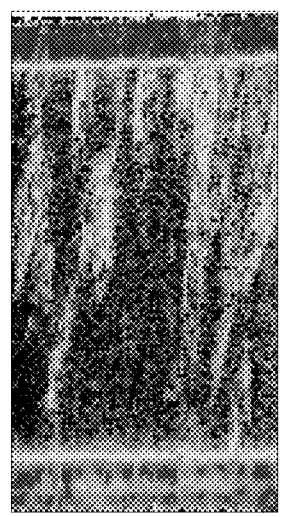
FIG. 12 is a map of minority carrier lifetime of the polycrystalline silicon ingot, according to comparative experiment 2.

FIG. 10 is a map of minority carrier lifetime of the polycrystalline silicon ingot, according to Example 9. FIG. 11 is a map of minority carrier lifetime of the quasi-single crystal, according to comparative experiment 1. FIG. 12 is a map of minority carrier lifetime of the polycrystalline silicon ingot, according to comparative experiment 2. It can be seen from FIGS. 10-12 that, one embodiment of the present invention prepares polycrystalline silicon ingot of long minority carrier lifetime and few central area for minority carriers (area of high dislocation in a certain extent). Comparative experiment 1 prepares central area of quasi-single crystals exhibits a divergent pattern (indicating that dislocations are prone to expand). Comparative experi-

What is claimed is:

1. A method for preparing polycrystalline silicon ingot, comprising:
    (1) laying a microcrystalline nucleating source layer at the bottom of the crucible, the microcrystalline nucleating source layer is microcrystalline silicon and/or amorphous silicon; thickness of the microcrystalline nucleating source layer is a first height; the microcrystalline nucleating source layer is the nucleating source of silicon material layer;
    (2) feeding silicon onto the microcrystalline nucleating source layer, melting the silicon to form molten silicon by heating, wherein a solid-liquid interface formed after the silicon is melted completely reaches the surface of the microcrystalline nucleating source layer or is deep into the microcrystalline nucleating source layer and the height to the bottom of the crucible is greater than or equal to 1 mm, regulating a thermal field to achieve supercooled state to grow crystals from the molten silicon on the base of the microcrystalline nucleating source layer;

(3) after the crystallization of molten silicon is completely finished, performing annealing and cooling to obtain polycrystalline silicon ingot.

2. The method for preparing polycrystalline silicon ingot according to claim 1, when solid-liquid interface formed after the silicon is melted completely is deep into the microcrystalline nucleating source layer and the height to the bottom of the crucible is greater than or equal to 5 mm, regulating the thermal field to achieve supercooled state to grow crystals from the molten silicon on the base of the microcrystalline nucleating source layer.

3. The method for preparing polycrystalline silicon ingot according to claim 1, wherein the first height is in a range of 1-150 mm.

* * * * *